United States Patent [19]

Moss et al.

[11] Patent Number: 5,250,135

[45] Date of Patent: Oct. 5, 1993

[54] REAGENT SOURCE

[75] Inventors: Rodney H. Moss, Felixstowe; Donald C. Bradley, Pinner; Marc M. Faktor, London; Dario M. Frigo, Kentish Town, all of England

[73] Assignee: British Telecommunications public limited company, London, England

[21] Appl. No.: 536,086

[22] Filed: Jun. 11, 1990

Related U.S. Application Data

[63] Continuation of Ser. No. 52,399, May 21, 1987, abandoned.

[30] Foreign Application Priority Data

May 21, 1986 [GB] United Kingdom ............... 8612402

[51] Int. Cl.$^5$ ............................................... C30B 25/16
[52] U.S. Cl. ................................... 156/601; 156/610; 156/611; 156/613; 156/614; 156/DIG. 61; 156/DIG. 70
[58] Field of Search ............... 156/601, 610, 611, 613, 156/614, DIG. 61, DIG. 70

[56] References Cited

U.S. PATENT DOCUMENTS

| 3,867,202 | 2/1975 | Ichiki et al. ........................ 156/610 |
| 4,250,205 | 2/1981 | Constant et al. ............ 156/DIG. 70 |
| 4,533,410 | 8/1985 | Ogura et al. ........................ 156/614 |

FOREIGN PATENT DOCUMENTS

| 0117051 | 8/1984 | European Pat. Off. ............ 156/610 |
| 0175030 | 3/1986 | European Pat. Off. ............ 156/610 |
| 0175601 | 3/1986 | European Pat. Off. ............ 156/610 |
| 1947463 | 8/1970 | Fed. Rep. of Germany ...... 156/610 |
| 60-245214 | 12/1985 | Japan ................................. 156/610 |

OTHER PUBLICATIONS

Journal of The Chemical Society, Faraday Transactions I, 1973 vol. 69, "Growth of Crystals from the Gas Phase" by Faktor et al, pp. 1916–1925.
Journal of The Chemical Society, Faraday Transactions I, 1974 vol. 70, "Modified Entrainment Method for Measuring Vapour Pressures and Heterogeneous Equilibrium Constants" Parts 1–4 pp. 2267–2312.
Solid State Devices 1982, ESSDERC-SSSDT Meeting, Munich, Sep. 13-16th, 1982, pp. 51–72, A. Goetzberger and M. Zerbst, Weinheim, Del.
J. Hallais: "Metal organic vapour phase epitaxy: the key issues" pp. 53–56: Chemistry of the growth and reactor design.
Moss et al, "A New Approach To MOCVD of Indium Phosphide and Gallium-Indium Arsenside", Journal of Crystal Growth, vol. 55 (1981) pp. 129–134.
Moss, "Adducts in the Growth of III-V Compounds", Journal of Crystal Growth, vol. 68 (1984) pp. 78–87.
Moore et al., "High Mobility InP Epitaxial Layers Prepared . . . ", Journal of Crystal Growth, vol. 77 (1986) pp. 19–22.
Fakter et al, "Growth of Crystals From The Gaspaase, Part 4, Growth of Gallium Arsenide". . . , N.R.I.S.I., British Museum, Nov. 27, 1973, pp. 1915, 1917, 1926 and 1923 to 1925.

Primary Examiner—Robert Kunemund
Attorney, Agent, or Firm—Nixon & Vanderhye

[57] ABSTRACT

A method of providing a reagent into a chemical process said provision being in the vapor phase and at a controlled mass flow rate wherein the method comprises:
(a) providing a gas stream which contains a gaseous phase complexing agent for the reagent said complexing agent being provided at a controlled partial vapor pressure in said gas stream;
(b) providing a primary source of the reagent in a reservoir which is connected to the gas stream via a diffusion path;
(c) causing the gaseous phase complexing agent to diffuse into the reservoir at a mass flow rate controlled by its partial pressure in the gas stream;
(d) causing the gaseous phase complexing agent in the reservoir to react with the primary source to generate a gaseous phase complex of the reagent and the gaseous phase complexing agent, said generation being, in the steady state, at a rate equivalent to the rate of inflow of said complexing agent;
(e) causing the gaseous phase complex to diffuse out of the reservoir into the gas stream at a rate, in the steady state, which is equivalent to its rate of generation in stage (d);
whereby the mass flow of reagent occurs at a rate defined and controlled by the vapor pressure of the vapor phase complexing agent in the gas stream.

3 Claims, 1 Drawing Sheet

REAGENT SOURCE

This is a continuation of application Ser. No. 07/052,399, filed May 21, 1987, now abandoned.

This invention relates to a reagent source and more particularly to the provision at a controlled mass flow rate of a reagent, e.g. an organo-metallic reagent, into metal organic vapour phase epitaxy (which is conveniently abbreviated to MOVPE).

MOVPE is a widely used process to grow semiconductor layers onto semiconductor substrates. The growth is achieved by passing (cold) gaseous reactants in an inert gas stream over a hot, e.g. 600°-800°, exposed surface of a substrate. The reaction occurs in contact with the hot surface and the product is deposited in the form of a single crystal. Some examples of epitaxy reactions, i.e. the overall reaction which occurs on the hot surface, include:

(1) $In(R')_3$ with $PH_3$ to give InP
(2) $Ga(R')_3$ with $AsH_3$ to give GaAs
(3) $Al(R')_3$ with $AsH_3$ to give AlAs wherein R' is an alkyl group, e.g. an alkyl group with 1 to 5 carbon atoms such as ethyl or, particularly, methyl.

It is conventional to produce mixed systems by operating a plurality of reactions simultaneously and to achieve the necessary flexibility it is standard practice to utilise separate and independent supply systems for each of the reactants and the inert gases. Some of the reagents, e.g. $PH_3$ and $AsH_3$, are gases and accurate devices, e.g. mass flow controllers are available to control the flow rate of a gas. The organo-metallic reagent is usually a metal alkyl, e.g. one or more of the trialkyls identified above. These are either volatile solids or volatile liquids and controlling the supply of these is more difficult.

Liquid and solid reagents are usually supplied into MOVPE by the entrainment method. This comprises passing a stream of gas over a solid or bubbling it through a liquid. The vapour pressure is an important control parameter and, because vapour pressure is strongly temperature dependent, even very accurate thermostats provide at best only adequate control. Other sources of error include variations in the efficiency of pick-up and the effect of flow-rate.

A modified entrainment method has been proposed (J. Chem. Soc., Faraday Trans. (1974) 70, 2267 by Battat, Faktor, Garrett and Moss). This method still utilises the evaporation of a solid or a liquid but the rate of supply is controlled by a diffusive resistance. The inclusion of the resistance substantially enhances the accuracy but it also limits the supply rate whereby the modified entrainment is not generally applicable to MOVPE.

There are disadvantages associated with the alkyls (and particularly with trimethyl indium). Thus the alkyls are liable to spontaneous ignition and they may undergo other undesirable reactions during transport in the MOVPE. To reduce these disadvantages it has been proposed to form adducts or complexes of the metal alkyls. Thus a compound known as "diphos":

$(C_6H_5)_2PC_2H_4P(C_6H_5)_2$ forms a solid adduct with the metal alkyl, e.g. with trimethyl indium. The mole ratio is 2:1 since one metal alkyl attaches itself to each phosphorous atom. The diphos adduct is much safer and more convenient to handle and the formation of the adduct can also be used as an extra purification stage. It has also been proposed to use other adducts, e.g. amine complexes, of metal alkyls in the gas stream which supplies reagents into the MOVPE reaction chamber in order to suppress undesired reactions during transport. On heating, an amine complex dissociates to give the metal alkyl and the amine. The metal alkyl participates as usual in the MOVPE growth while the amine passes to waste without affecting the growth.

According to this invention, which is defined in the claims, a gaseous phase complexing agent is caused to diffuse, at a controlled rate, into the presence of the primary source. The complexing agent reacts with the primary source to form a gaseous phase complex which is conveyed into the process. The partial vapour pressure of the complexing agent is kept low. Under these conditions it has been found possible to supply adequate amounts of reagent into the process and to control accurately the rate of the supply.

Since this process uses adducts it not only provides the accurate control which is needed but it also takes advantage of the good properties associated with adducts.

The invention will be further described with reference to the accompanying drawings in which:

DETAILED DESCRIPTION OF THE INVENTION

Figure 1:
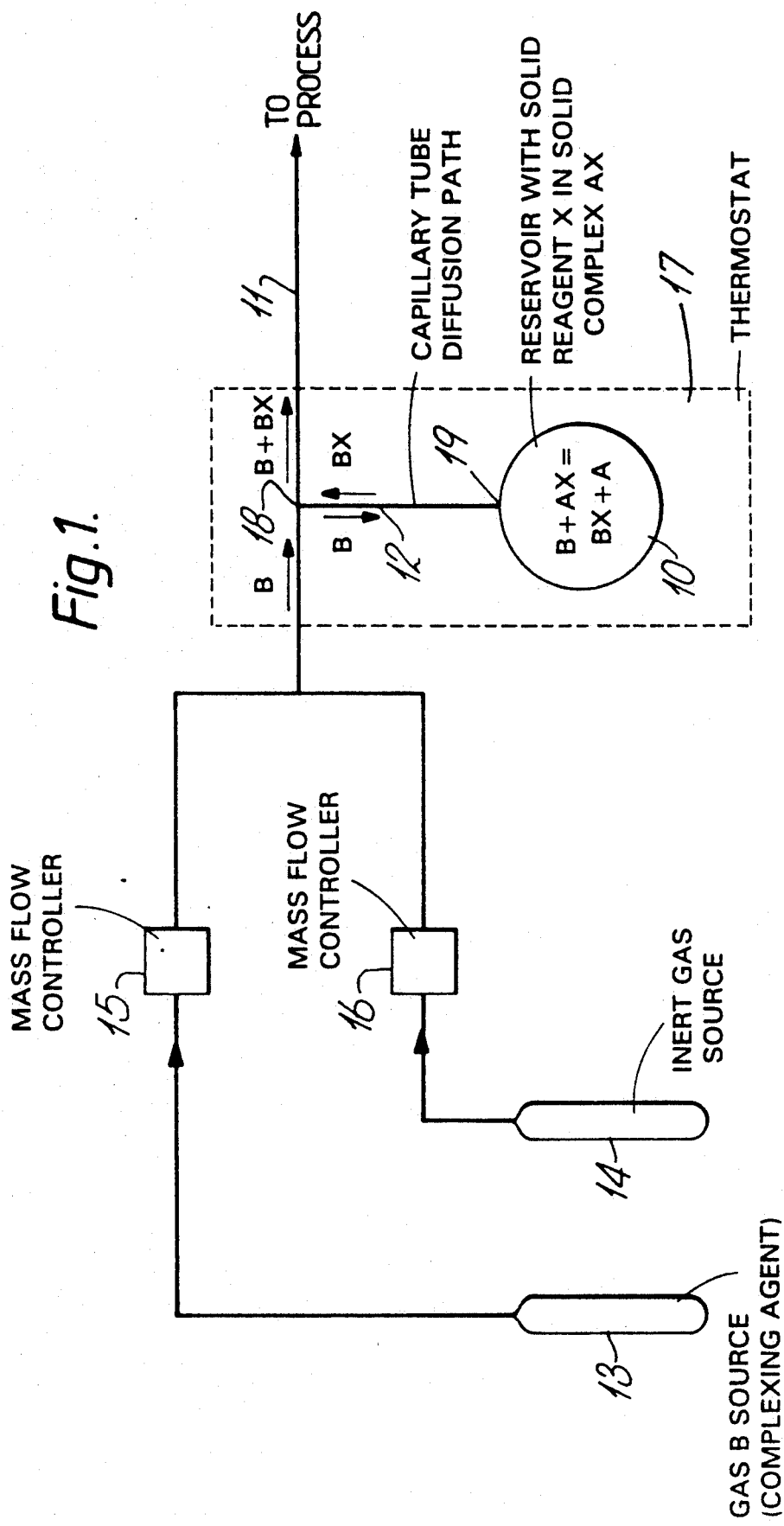
FIG. 1 is a diagrammatic illustration of a source according to the invention.

FIG. 1 illustrates a source according to the invention which source is designed to provide a vapour phase organo-metallic reagent into a process such as organo-metallic vapour phase epitaxy and to control this supply to a constant mass-rate. The method uses a solid phase complexing agent and a gaseous phase complexing agent. To generalise: the organo-metallic compound will be represented as X, the solid phase complexing agent will be represented as A and the gaseous phase complexing agent as B. A carrier gas, e.g. helium, is also used. The two complexes will be represented as AX and BX (but the mole ratios of A:X and B:X are to be taken as unspecified). It is emphasised that, at the temperatures and pressures of operation, the molecular species A and AX are solid while the species B and BX are gaseous. The temperature and pressure are chosen so that these conditions apply.

The overall reaction used by the invention is the displacement $$AX + B = BX + A$$

but this may occur in two separate reactions:

$$AX = A + X \quad (1)$$

$$X + B = BX \quad (2)$$

The equilibrium constants are chosen so that at equilibrium, reaction (1) gives a higher vapour pressure of X than reaction (2).

This implies that, in the vapour phase, the partial pressures of X and B will be substantially zero.

The preferred species are:

$$X = Me(R')_3$$

$A = (C_6H_5)_2P-C_2H_4-P(C_6H_5)_2$ $B = N(R'')_3$ $AX = [(C_6H_5)_2P-C_2H_4-P(C_6H_5)_2][Me(R')_3]_2$ $BX = [N(R'')_3][Me(R')_3]$ wherein Me is selected from In, Ga and Al;

R' is selected from alkyl groups with 1 to 5 carbon atoms, e.g. ethyl and, especially methyl; and R'' is selected from alkyl groups with 1 to 5 carbon atoms, e.g. ethyl and, especially methyl.

As shown in FIG. 1 the source apparatus comprises a reservoir 10 which contains the solid participants A and AX. The solid complex AX was placed in reservoir 10 before starting and it is converted into solid phase complexing agent A during use.

The reservoir 10 is connected to a gas line 11 by means of a capillary tube 12. The gas line 11 is supplied from bottles 13 and 14 with mass flow controllers 15 and 16. Bottle 13 conveniently contains a mixture of carrier gas and B, e.g. a mixture which contains 8-10 mole % of B. Bottle 14 contains pure inert gas.

The mass flow controllers 15 and 16 provide accurate control of the flow rate and hence they provide accurate control of the concentration of B in carrier gas in the line 11. It will be noted that the reservoir 10 and capillary 12 form a conventional effusion cell in which the rate of diffusion through capillary 12 constitutes the important control parameter. Since diffusion is temperature dependent the reservoir 10 and capillary 12 are located in a thermostat 17. Since the diffusion is only weakly temperature dependent the control is accurate. This arrangement also ensures a suitable reaction temperature.

The following sizes, which are quoted by way of example only, have been found suitable for the reservoir 10 and the capillary 12:

| | |
|---|---|
| Capacity of reservoir 10 | 50 cc |
| Length of capillary 12 | 40 mm |
| Diameter of capillary 12 | 4 mm |

The equipment also includes joints (not shown) to permit assembly and dis-assembly, e.g. for replenishment of solid complex AX in the reservoir 10.

The control mechanism established by the system described above will now be considered. The hypothetical initial state for this explanation is reservoir 10 containing inert gas in equilibrium with solid complex AX at the temperature of thermostat 17. The gas line 11 contains a stream of inert gas and gaseous phase complexing agent B at a controlled concentration fixed by the mass flow controllers 15 and 16.

In this initial state, gaseous phase complexing agent B will diffuse into capillary 12 and thereby establish a partial pressure gradient from the primary end 18 to the secondary end 19 where the partial pressure of the gaseous phase complexing agent B is effectively zero. When B enters the reservoir 10 it encounters organo-metallic X in the gas phase and it reacts to form gaseous phase adduct BX. This reaction has two effects. The first effect is that gaseous phase complexing agent B is substantially removed whereby its partial pressure in reservoir 10 remains substantially zero and the inlet diffusion conditions are substantially unaffected. The second effect is to reduce the partial pressure of organo-metallic X whereby further decomposition of solid adduct AX occurs.

The formation of BX means that its partial pressure in the reservoir 10 rises and hence its diffusion rate out of the reservoir 10 via capillary 12 also rises. Eventually a steady state is established in which the outflow of gaseous phase complex BX matches the inflow of complexing agent B and the partial pressure of gaseous adduct BX in the reservoir 10 achieves a steady state at the level appropriate for this match.

The steady state conditions in the reservoir 10 should also be considered. The vapour pressure of organo-metallic X is depressed below the equilibrium with primary adduct AX. The result is that the rate of decomposition of AX is matched to the inflow of B.

It is emphasised that the diffusion rate of gaseous complexing agent B is controlled by its partial pressure at the primary end 18 of the capillary 12 and not by the flow rate of the mixture. Within the operational range, altering the flow rate only alters the amount of the excess but it does not change the partial pressure and hence it does not alter the rate of diffusion.

The two bottles 13 and 14 and the two mass flow controllers 15 and 16 are needed so as to change the ratio of the two flows. This changes the partial pressure of gaseous complexing agent B in the gas stream which also changes its rate of diffusion from primary end 18 to secondary end 19. All other steady state conditions will be changed to match the changed diffusion rate. The changes consequent upon a higher partial pressure will now be considered. Four control mechanisms can be distinguished.

(1) The higher partial pressure of agent B at primary end 18 causes an increase in the rate of diffusion through capillary 12.

(2) The increased rate of (1) increases the rate of formation of gaseous complex BX.

(3) The increased rate of formation of secondary complex BX, i.e. item (2) above, increases the partial pressure of gaseous complex BX.

(4) The increased partial pressure of BX increases the rate of diffusion of BX out of the reservoir 10. The rate of diffusion-out of BX stabilises when it matches the rate of diffusion-in of B, i.e. item (1) above.

It is emphasised that the primary control is provided by item (1) above because all of items (2) to (4) adjust to item (1). It is therefore instructive to consider the three factors which influence the rate of diffusion.

The diffusion resistance of capillary 12 is clearly an important factor since short fat tubes will allow a faster rate than long thin tubes. In practice the tube is a fixed element and therefore the resistance is constant. A new or different tube 12 would require re-calibration.

The temperature of the diffusion path also affects the diffusion rate. Gases diffuse slower at higher temperatures and, therefore, the thermostat 17 is needed to provide a constant temperature. It is emphasised that diffusion is only weakly temperature dependant and at 100° C. (a convenient working temperature) a thermostat error of one degree (±1° C.) would cause an error in the diffusion rate of about ±0.5%. Therefore, with even a moderate quality thermostat, it is possible to control the diffusion process to a very good level of accuracy.

The Partial Pressure Gradient of agent B applied to the capillary 12 is also a control parameter. Since the partial pressure of gaseous complexing agent B at the secondary end 19 is always very low it can be taken as zero, leaving the partial pressure at primary end 18 as the control parameter. As explained above, this partial pressure is conveniently controlled and adjusted by mass flow controllers 15 and 16.

The control process described above is considerably more accurate than the entrainment method described above because the strongly temperature dependent effect of vapour pressure is replaced by the weakly dependent effect of diffusion rate. Furthermore inaccuracies related to efficiency of pick-up are eliminated. The restrictions on supply rate, which are inherent in the modified entrainment method, are overcome because the secondary adduct is gaseous. Thus, even when the primary source is involatile or when it has a low decomposition pressure, adequate amounts of reagent will pass through the diffusive resistance.

The method of the invention utilises adducts and, therefore, it offers the advantages associated with these.

We claim:

1. A method of growing a semiconductor product by metal organic vapour phase epitaxy, which method includes providing a controlled mass flow rate of an organo-metallic reagent X into a metal organic vapour phase epitaxy reaction wherein the reagent X is in the form of a gaseous phase complex BX that is produced from a solid phase complex AX and a gaseous phase complexing reagent B, said method comprising the steps of:

(a) providing a solid phase complex AX in a reservoir having a capillary diffusion path with a first end connected thereto;
(b) providing a controlled partial vapour pressure of a gaseous phase complexing reagent B at an opposite second end of said capillary diffusion path;
(c) conducting said gaseous phase complexing agent B from said second end of said capillary diffusion path to said first end of said capillary diffusion path wherein the reaction $$AX + B \rightarrow BX + A$$

occurs in said reservoir;
(d) conducting said gaseous phase complex BX produced by said reaction from said first end of said capillary diffusion path to said second end of said capillary diffusion path, and
(e) conducting said gaseous phase complex BX from said second end of said capillary diffusion path to a metal organic vapour phase epitaxy growth process, whereby the mass flow rate of BX to the metal organic vapour phase epitaxy growth process is controlled, at least in part, by controlling said partial vapour pressure of B at said second end of said capillary diffusion path.

2. A method according to claim 1, in which A is $(C_6H_5)_2PC_2H_4P(C_6H_5)_2$, B is an amine, and X is selected from the group consisting of indium trialkyls, aluminum trialkyls and gallium trialkyls.

3. A method according to claim 1, wherein B is trimethylamine.

* * * * *